(12) United States Patent
Urabe et al.

(10) Patent No.: US 6,969,291 B2
(45) Date of Patent: Nov. 29, 2005

(54) DISPLAY APPARATUS USING ORGANIC ELECTROLUMINESCENT ELEMENT AND MANUFACTURING METHOD THEREOF

(75) Inventors: Tetsuo Urabe, Kanagawa (JP); Tatsuya Sasaoka, Kanagawa (JP); Mitsunobu Sekiya, Tokyo (JP); Machio Yamagishi, Kanagawa (JP)

(73) Assignee: Sony Corporation, (JP)

(*) Notice: Subject to any disclaimer, the term of this patent is extended or adjusted under 35 U.S.C. 154(b) by 135 days.

(21) Appl. No.: 10/608,197

(22) Filed: Jun. 30, 2003

(65) Prior Publication Data

US 2004/0090175 A1 May 13, 2004

Related U.S. Application Data

(62) Division of application No. 09/711,880, filed on Nov. 15, 2000, now Pat. No. 6,614,174.

(30) Foreign Application Priority Data

Nov. 19, 1999 (JP) .............................. P11-329810

(51) Int. Cl.[7] .............................................. H01J 9/00
(52) U.S. Cl. ...................................................... 445/23
(58) Field of Search ............. 445/23–25; 313/501–506

(56) References Cited

U.S. PATENT DOCUMENTS

| 5,121,029 A | 6/1992 | Hosokawa et al. |
| 6,075,317 A | 6/2000 | Keyser et al. |
| 6,087,772 A | 7/2000 | Ootsuki et al. |
| 6,194,837 B1 | 2/2001 | Ozawa |
| 6,380,672 B1 | 4/2002 | Yudasaka |

FOREIGN PATENT DOCUMENTS

| EP | 0 883 190 A2 | 12/1998 |
| EP | 0 895 219 A1 | 2/1999 |

OTHER PUBLICATIONS

European Search Report dated Feb. 5, 2004.

*Primary Examiner*—Joseph Williams
(74) *Attorney, Agent, or Firm*—Rader, Fishman & Grauer PLLC; Ronald P. Kananen (57) ABSTRACT

A display apparatus includes a substrate, a plurality of pixels formed on the substrate, and a barrier plate for separating adjoining pixels from each other. Each pixel includes a lower layer portion having wiring formed on the substrate, an upper layer portion having an organic electro-luminescent element, and a middle layer portion for insulating the lower layer portion and the upper layer portion from each other electrically. The organic electro-luminescent element is connected with the windings through a contact hole formed in the middle layer portion. The barrier plate is disposed in the upper layer portion so as to overlap with a region including a contact hole not suitable for forming the organic electro-luminescent element.

19 Claims, 8 Drawing Sheets

DISPLAY APPARATUS USING ORGANIC ELECTROLUMINESCENT ELEMENT AND MANUFACTURING METHOD THEREOF

This application is a divisional application of application No. 09/711,880; filed: Nov. 15, 2000, now U.S. Pat. No. 6,614,174

BACKGROUND OF THE INVENTION

1. Field of the Invention

The present invention relates to a display apparatus using an organic electro-luminescent element and a manufacturing method thereof. In particular, the invention relates to a technique for improving a display apparatus using an organic electro-luminescent element, emitted light of which is taken out of its upper surface on its cathode side, to have a larger aperture rate.

2. Description of the Related Art

An organic electro-luminescent element may be utilized as a pixel of, for example, an active matrix type display apparatus. An organic electro-luminescent display apparatus using an organic electro-luminescent element as its pixel is regarded as a promising next generation flat panel display apparatus in place of a liquid crystal display apparatus.

Figure 7:
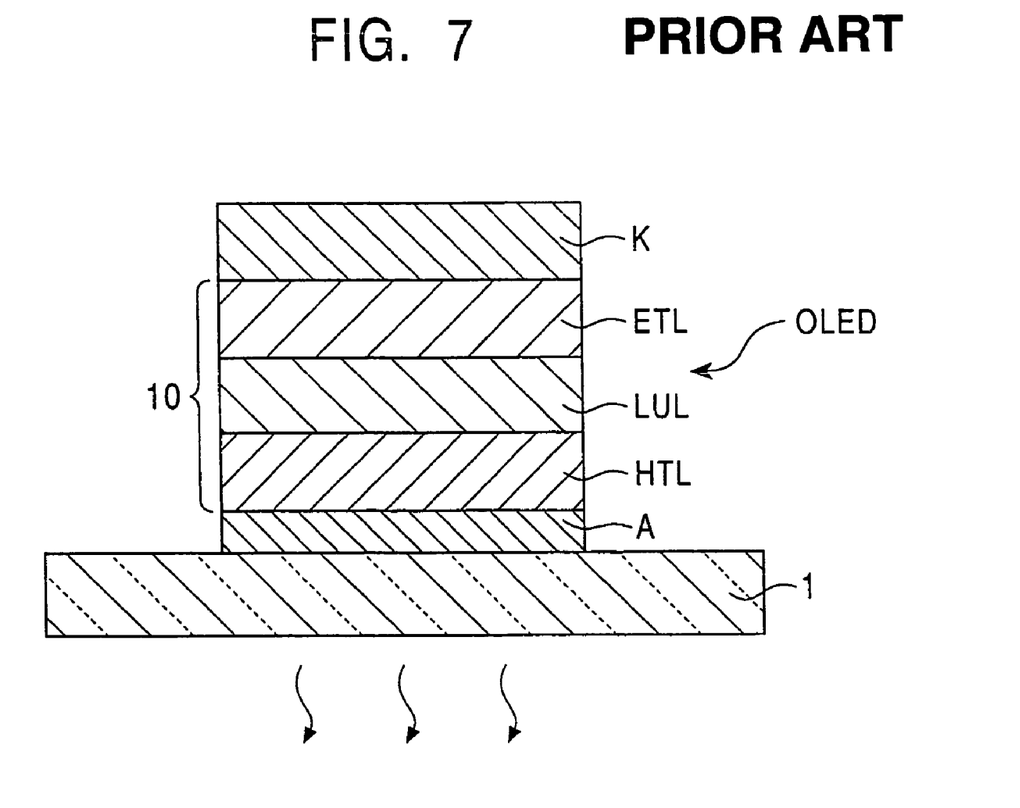
FIG. 7 is a sectional view showing an example of a conventional organic electro-luminescent element.

FIG. 7 shows a structure of a conventional organic electro-luminescent element. In FIG. 7, on a glass substrate 1, there is formed an anode A of a transparent conducting film such as ITO (Indium Tin Oxide). An organic layer 10 is laminated on the anode A. Then, a cathode K made from a metal is formed on the organic layer 10. Thereby, the organic electro-luminescent element having a diode structure can be obtained.

The cathode K is made from, for example, an alloy of aluminum and silver or an alloy of magnesium and silver. The thickness of the cathode K is about 100 nm, for example.

The organic layer 10 is basically made by laminating a hole transporting layer HTL, a luminescent layer LUL and an electron transporting layer ETL on the anode A in the order.

In such a structure, when electrons and holes are injected from the cathode K and the anode A, respectively, the injected electrons and holes pass through the electron transporting layer ETL and the hole transporting layer HTL, respectively, and then they are recombined at the luminescent layer LUL to emit light.

In this case, the emitted light is taken out of the glass substrate 1 side. That is, the structure of the OLED is the so-called downside light taking out structure. The luminous element made by sandwiching the organic layer 10 between the cathode K and the anode A like this becomes an organic light emitting diode (OLED).

Because the response speed of the OLED as an organic light emitting diode is $1\mu$ sec. or less, it is possible to perform the time division duty drive of the OLED arranged in a simple matrix form when the OLED is applied to a display apparatus. However, when the OLED comes to have high duty with the increase of its pixels, it is necessary to supply an instantaneous large current to the OLED for securing enough brightness.

On the other hand in an active matrix type display system, because a signal voltage is kept by holding capacitance formed between the OLED and a thin film transistor at each pixel during one frame interval, a drive current can be imposed on the OLED in accordance with the signal voltage. Consequently, it is not necessary to supply the instantaneous large current like in the case of the simple matrix system, and thereby the OLED is scarcely damaged.

However, when a panel display apparatus is designed by means of the active matrix system using a switching element of a thin film transistor, the thin film transistor is formed by being laminated on the glass substrate 1. Consequently, an opened area for taking light out of the OLED is narrowed by the thin film transistor formed on the glass substrate 1 in case of the downside light taking out structure shown in FIG. 7. Therefore, the downside light taking out structure has a problem that the aperture rate thereof is reduced, wherein the aperture rate is defined by dividing an effective display area with unit pixel area.

Figure 8:
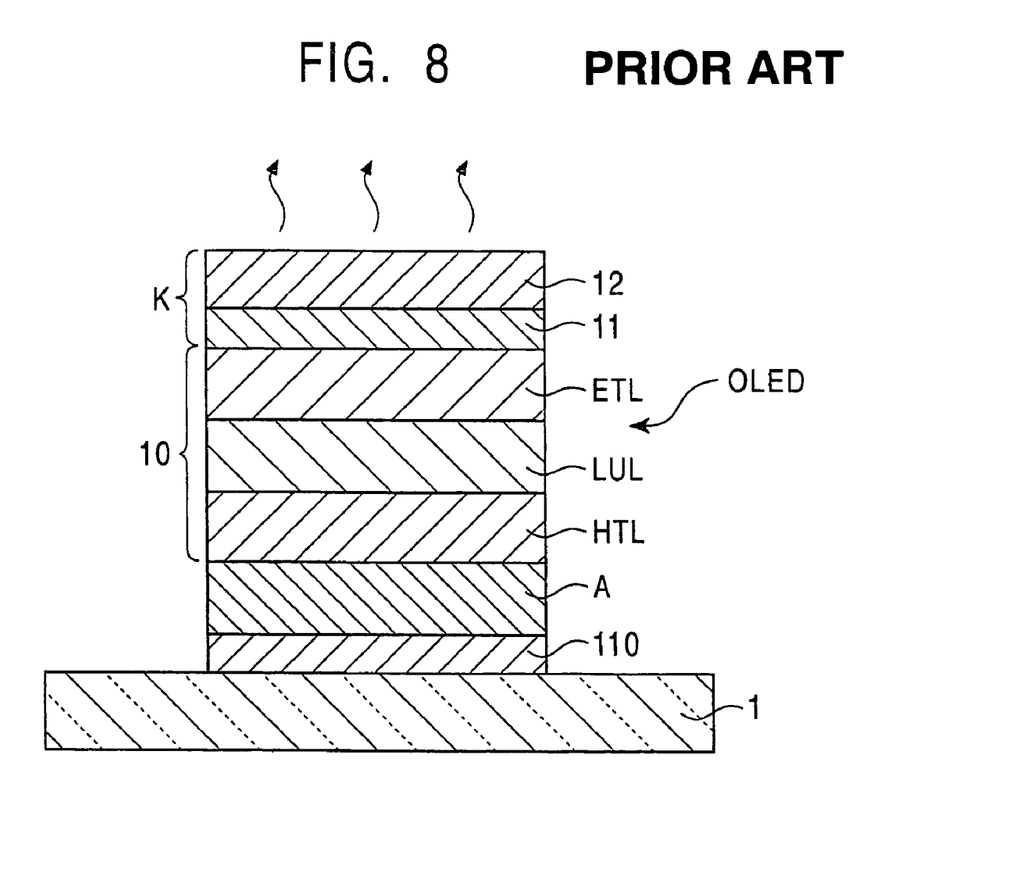
FIG. 8 is a sectional view showing another example of a conventional organic electro-luminescent element.

For avoiding the problem, the so-called upside light taking out structure where emitted light is taken out of the cathode K disposed on the upper side of the glass substrate 1 is available.

The upside light taking out structure is shown in FIG. 8. As shown in FIG. 8, a reflecting layer 110 is formed on the glass substrate 1. An anode A composed of a transparent conducting film such as ITO is formed on the reflecting layer 110. An organic layer 10 is superposed on the anode A. And then, a metal layer 11 is formed on the organic layer 10. In this case, the thickness of the metal layer 11 is 10 nm or less for making it possible that emitted light penetrates the metal layer 11. A transparent conducting layer 12 such as ITO is formed on the metal layer 11.

Because the emitted light is taken out of the upside, the cathode K is made of a metal foil film having a low work function so that its transmittivity is high and electrons can effectively be injected. For example, the cathode K is made by forming an alloy of aluminum and lithium to be a thin film of 10 nm in thickness or forming an alloy of magnesium and silver to be a thin film of 10 nm in thickness.

A transparent conducting layer 12 is further formed on the metal layer 11 to be a thickness, for example 100 nm. The transparent conducting layer 12 performs a role of a protection of the thin metal layer 11 and a role of changing the resistance of wiring to be low.

In such a device structure of the upside light taking out structure, the numerical aperture of a pixel can principally be enlarged in comparison with the device structure of the downside light taking out structure. However, when a display apparatus is composed by arranging devices of the upside light taking out structure in a matrix form as its pixels, there is often arranged a structure such as a barrier plate for interrupting light on the front face side of the substrate 1. Accordingly, it is urgently necessary to develop a mounting structure capable of realizing a larger aperture rate.

SUMMARY OF THE INVENTION

For resolving the aforesaid problems of the conventional techniques, the inventors of the present invention take the following measures.

That is, according to an aspect of the present invention there is provided a display apparatus including a substrate, a plurality of pixels formed on the substrate, and a barrier plate for separating adjoining pixels of the pixels from each other, wherein: each of the pixels comprises a lower layer portion including wiring formed on the substrate, an upper portion including an organic electro-luminescent element, and a middle layer portion for electrically insulating the lower layer portion and the upper layer portion from each other, and the organic electro-luminescent element is connected with the wiring through a contact hole formed in the middle layer portion, and further the barrier plate is disposed in the upper layer portion so as to overlap with a region including the contact hole.

To put it concretely, the organic electro-luminescent element is composed of a reflective anode connected with the wiring, a transparent cathode disposed at a front face of the organic electro-luminescent element, and an organic layer held between the anode and the cathode, and the organic layer emits light by recombination of holes supplied from the anode and electrons supplied from the cathode, and further the emitted light is taken out of the cathode disposed at the front face.

In this case, the organic layer is composed of laminated films piled up selectively by means of a mask disposed over the substrate in a way of putting the barrier plate between the mask and the substrate.

Furthermore, the lower layer portion comprises a scanning wiring, a part of the wiring, for supplying first electric information for selecting the pixels, a data wiring, another part of the wiring, for supplying brightness information for driving the pixels, a first active element controlled by second electric information supplied from the scanning wiring and having a function of writing the brightness information supplied from the data wiring into one of the pixels, and a second active element having a function of controlling emission of light of the organic electro-luminescent element by supplying a current to the organic electro-luminescent element in accordance with the written brightness information.

According to the aspect of the invention, the area of a pixel can be effectively utilized and the region, which contributes to light emitting, of an organic electro-luminescent element can be enlarged by forming a barrier plate in a contact region for connecting the organic electro-luminescent element belonging to an upper layer portion and a wiring belonging to a lower layer portion. A stable light emitting characteristics can be obtained by enlarging the region contributing to light emitting.

BRIEF DESCRIPTION OF THE DRAWINGS

The above and other objects, features and advantages of the present invention will become more apparent from the following description of the presently preferred exemplary embodiments of the invention taken in conjunction with the accompanying drawings, in which.

DESCRIPTION OF THE PREFERRED EMBODIMENTS

Hereafter, the drawings are referred while an embodiment of the present invention is described in detail.

Figure 1:
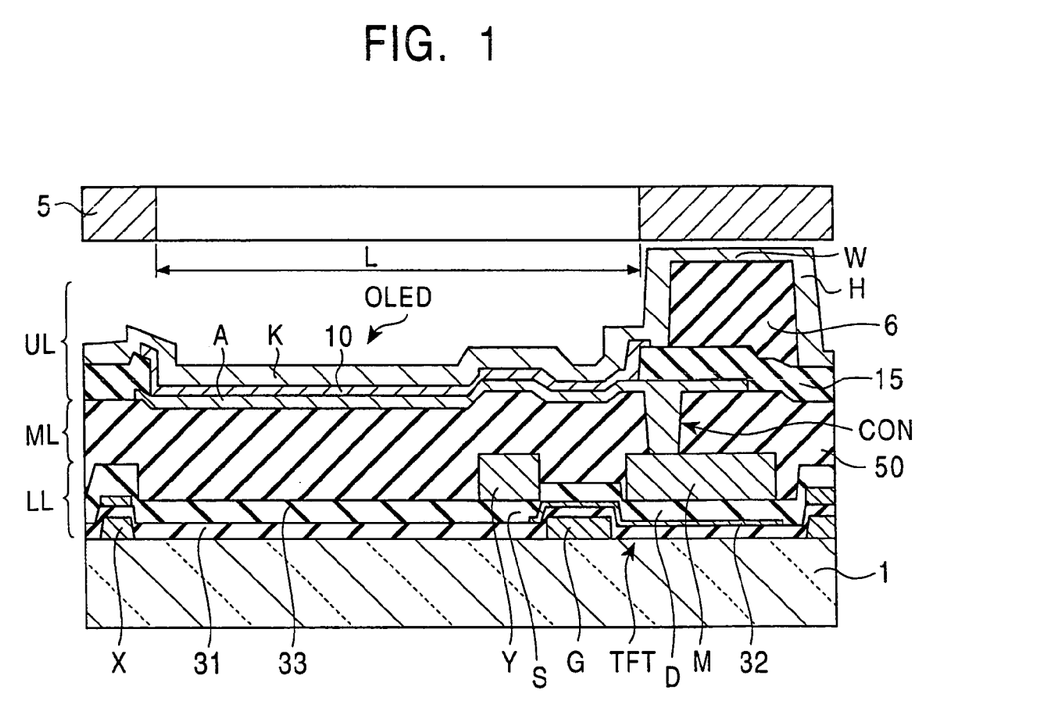
FIG. 1 is a partial sectional view showing an embodiment of a display apparatus according to the present invention.

FIG. 1 is an example of a partial sectional view showing the structure of a display apparatus according to the present invention. FIG. 1 shows one of pixels of the display apparatus.

As shown in FIG. 1, the display apparatus includes a substrate 1, a pixel formed on the substrate 1, and a barrier plate 6 for separating the pixel from adjoining pixels. The pixel is separated to be a lower layer portion LL, a middle layer portion ML and an upper layer portion UL from the bottom side in the order. The lower layer portion LL includes a wiring such as a data wiring Y and a connecting wiring M formed on the substrate 1. The upper layer portion UL includes an organic electro-luminescent element OLED. The middle layer portion ML electrically insulates the lower layer portion LL and the upper layer portion UL from each other. The middle layer portion ML comprises an interlayer isolation film 50. The organic electro-luminescent element OLED is electrically connected with the connecting wiring M through a contact hole CON opened to the interlayer isolation film 50 constituting the middle layer portion ML.

As a specific feature, the barrier plate 6 is disposed in the upper layer portion UL so as to overlap with a region including the contact hole CON (hereafter referred to as "contact region"). In the contact region, wiring are intricate and there are many undulations. Consequently, the contact region is not suitable for forming the organic electro-luminescent element OLED. Even if the organic electro-luminescent element OLED is formed here, effective light emission for display cannot be obtained. Accordingly, the barrier plate 6 that is a structure not contributing to the light emission originally is disposed in the contact region.

By constructing the display apparatus like the above, the effective utilization of the area of a pixel is enabled, and the aperture rate can be improved in comparison with the prior art. The aperture rate of over 50 percent can be attained owing to the specific structure of the embodiment of this invention.

In the present embodiment, the organic electro-luminescent element OLED has the upside light taking out structure. That is, the organic electro-luminescent element OLED has a reflective anode A connected with the connecting wiring M, a transparent cathode K disposed at the front face of the organic electro-luminescent element OLED, and an organic layer 10 held between the anode A and the cathode K. The organic layer 10 emits light by recombination of holes supplied from the anode A and electrons supplied from the cathode K, and further the emitted light is taken out of the cathode K disposed at the front face.

As shown in the FIG. 1, the organic layer 10 is formed as wide as possible on a comparatively flat portion except for the contact region, and thereby the aperture rate of the pixel is enlarged. And, the barrier plate 6, which does not originally contribute light emitting, is formed in the contact region that is not suitable for forming the organic layer 10.

Incidentally, the aperture size L of one pixel is, for example 170 $\mu$m to 180 $\mu$m, and the width size W of the barrier plate 6 is, for example 30 $\mu$m to 40 $\mu$m. In addition, the height size H of the barrier plate 6 is, for example 3 $\mu$m to 5 $\mu$m.

The organic layer 10 is composed of laminated films piled up selectively by means of a mask 5 disposed over the substrate 1 in a way of putting the barrier plate 6 between the mask 5 and the substrate 1. In other words, the barrier plate 6 performs a role of a spacer between the substrate 1 and the mask 5 when the organic electro-luminescent element OLED is formed. Namely, the barrier plate 6 is disposed for preventing that the mask 5 erroneously contacts with the surface where the organic electro-luminescent element OLED is formed.

The present display apparatus is an active matrix type display apparatus. In the lower layer portion LL, there is disposed a scanning wiring X for supplying first electric information for selecting the pixels, a data wiring Y for supplying brightness information for driving the pixels, a first active element controlled by second electric information supplied from the scanning wiring X and having a function of writing the brightness information supplied from the data wiring Y into one of the pixels, and a second active element having a function of controlling emission of light of the organic electro-luminescent element OLED by supplying current to the organic electro-luminescent element OLED in accordance with the written brightness information.

In FIG. 1, a thin film transistor TFT formed on the substrate 1 is shown as the second active element. The thin film transistor TFT has a bottom gate structure composed of a gate electrode G, a gate insulating film 31 formed on the gate electrode G, and a semiconductor thin film 32 formed on the gate insulating film 31. It is needless to say that the so-called top gate structure causes no problem. The semiconductor thin film 32 has a channel area aligned with the gate electrode G as well as a source area S and a drain area D on both sides of the channel area.

The thin film transistor TFT having the aforesaid structure is covered by an interlayer isolation film 33. On the interlayer isolation film 33, the aforesaid data wiring Y and the connecting wiring M are formed. Although being not drawn in FIG. 1, the data wiring Y is electrically connected with the source area S of the thin film transistor TFT through the contact hole CON opened to the interlayer isolation film 33. Similarly, the connecting wiring M is also connected to the drain area D of the thin film transistor TFT through the contact hole CON opened to the interlayer isolation film 33. The anode A of the organic electro-luminescent element OLED is electrically connected with the drain area D of the thin film transistor TFT through the connecting wiring M by employing such a structure.

A method for manufacturing a display apparatus according to the present invention is described. FIG. 1 is referred still more in the description.

At first, a conducting material is formed on the surface of the substrate 1 made from glass or the like. Then, the gate electrode G is formed by patterning the formed conducting material to a prescribed shape. The scanning wiring X and so forth are simultaneously formed by using the same conducting material. As the conducting material, there can be used polycrystalline silicon to which impurities are injected to a high density, silicide, or metals having high melting points such as W, Mo.

Next, the gate insulating film 31 is formed by means of the CVD (Chemical Vapor Deposition) method, or the like. As the gate insulating film 31, for example, $SiO_2$, SiN or the like can be used.

The semiconductor thin film 32 is formed on the gate-insulating film 31. Amorphous silicon is piled on the gate insulating film 31 by, for example the CVD method. Then, the piled amorphous silicon is changed to polycrystalline silicon by means of the solid phase epitaxial growth method or the laser anneal method by UV laser light. Impurities are selectively injected to the thus obtained semiconductor thin film 32 to form the source area S and the drain area D. And then, the semiconductor thin film 32 is patterned in accordance with the shape of the thin film transistor TFT.

So as to cover the thus obtained bottom gate structure type thin film transistor TFT, the interlayer isolation film 33 made from for example $SiO_2$ is formed. The contact holes, not shown, connected with the source area S or the drain area D of the thin film transistor TFT are formed in the interlayer isolation film 33.

After that, a metal thin film is formed on the interlayer isolation film 33 by means of sputtering method or the like. The data wiring Y and the connecting wiring M are formed by patterning the metal thin film to a prescribed shape. As the metal thin film, aluminum is generally used. According to circumstances, a multilayer structure of Ti/TiN/Ti/Al/Ti/TiN/Ti or alloy layers such as AlSi and AlCu may be used.

In conformity with the aforementioned processes, the lower layer portion LL of a pixel is formed. On the lower layer portion LL, the interlayer isolation film 50 made from $SiO_2$ or the like is formed as the middle layer portion ML.

After forming the contact hole CON in the interlayer isolation film 50 by means of etching, the light reflective anode A made from a metal such as Al and Cr is formed on the interlayer isolation film 50. After forming the insulating layer 15 made from $SiO_2$ or the like on the anode A, a window portion is formed in the insulating layer 15 by etching. The organic electro-luminescent element OLED is formed at the window portion. As apparent from the FIG. 1, the window portion is disposed at a region except for the contact region including the contact hole CON. At this step, the barrier plate 6 is formed on the residual insulating layer 15. The barrier plate 6 is made from an organic or an inorganic insulating material. In the present embodiment, the barrier plate 6 is formed by piling $SiO_2$ to a thickness of 3 $\mu$m to 5 $\mu$m by means of sputtering. As apparent from FIG. 1, the barrier plate 6 is formed in a contact region including the contact hole CON.

After that, the mask 5 is disposed on the barrier plate 6 by utilizing it as a spacer. Then, the organic layer 10 is formed on the anode A by means of an evaporation method. At this time, the barrier plate 6 performs a role of a spacer so that the mask 5 does not contact with the surface of the substrate 1. After the evaporation of the organic layer 10, the transparent cathode K is formed on the whole surface of the substrate 1. The electric potential of the cathode K is kept to be a common value over all the pixels. In conformity with the aforementioned processes, the upper layer portion UL of each pixel is completed.

Figure 2:
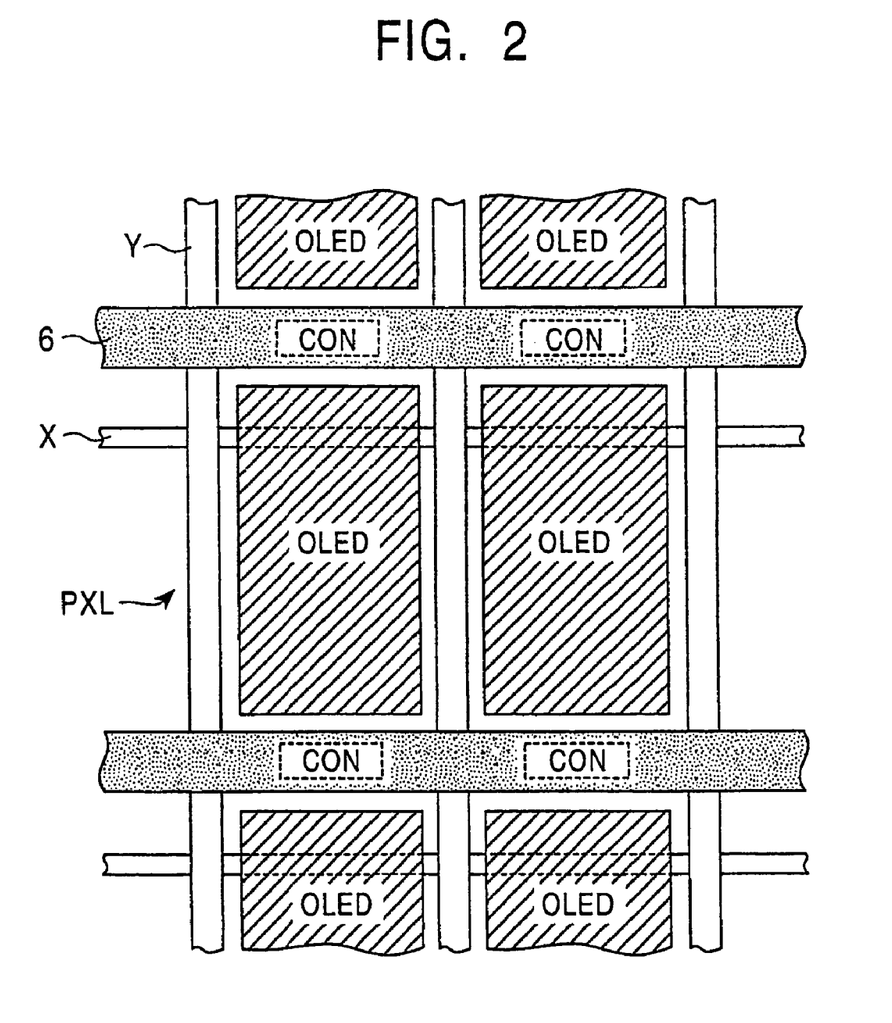
FIG. 2 is a partial plan view showing the embodiment shown in FIG. 1.

FIG. 2 is an example of a mimetic plan view of the display apparatus shown in FIG. 1. As shown in FIG. 2, the data wiring Y is arranged in the vertical direction of the sheet. And, the scanning wiring X is arranged in the lateral direction of the sheet. Moreover, the barrier plates 6 which are separating pixels PXL adjoining in the vertical direction are also arranged in the lateral direction. As described with reference to FIG. 1, the barrier plates 6 are disposed at regions overlapping the contact regions CON. The hatched portions in the pixels PXL are regions where the organic electro-luminescent elements OLED are formed. The hatched portions form effective light emission areas.

Figure 3:
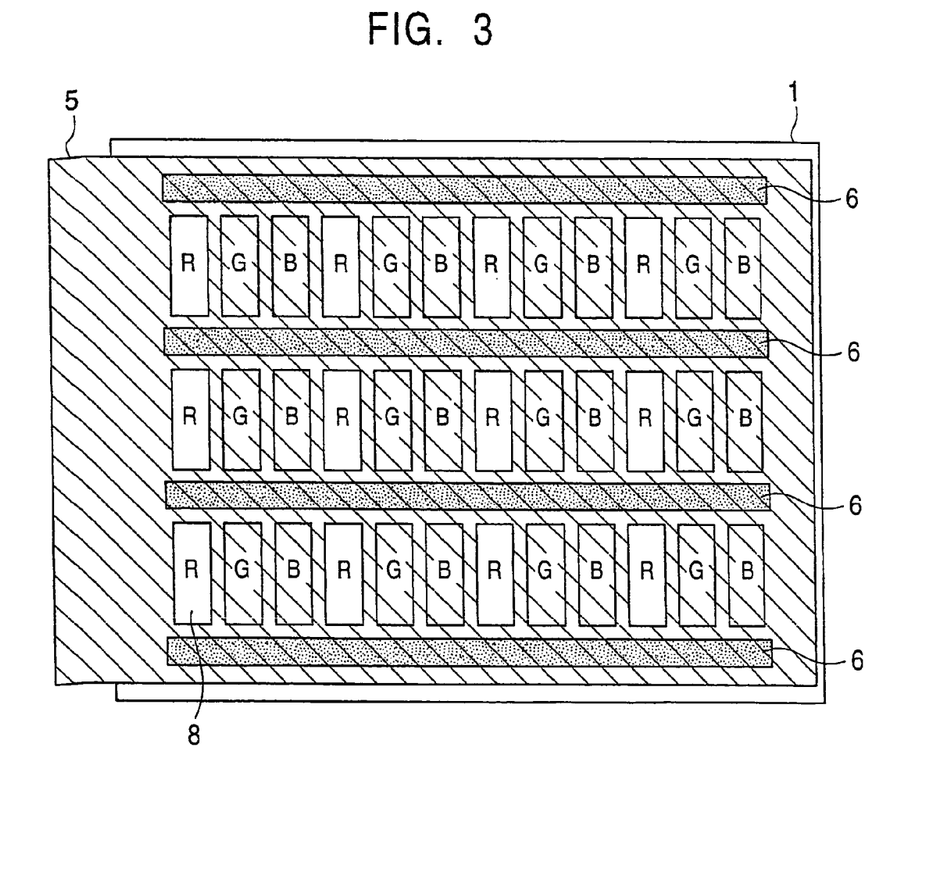
FIG. 3 is a mimetic plan view showing a relationship between a mask and a substrate.

FIG. 3 is an example of a mimetic plan view showing the relative positional relationships between the substrate 1 and the mask 5. The present example shows a case where pixels of three primary colors of red, green and blue are formed on the substrate 1 by means of a vacuum evaporation method.

The barrier plates 6 are formed in a state of a stripe on the surface of the substrate 1 in advance. The barrier plates 6 are made from an organic or inorganic insulating material. The barrier plates 6 can be formed on the surface of the substrate 1 by means of, for example screen printing method or sputtering method.

Between each of the barrier plates 6 formed in the state of the stripe, pixels of each of the three primary colors of the red, the green and the blue are formed. Accordingly, the mask 5 has a pattern 8 shown in FIG. 3, where rectangular openings are formed at positions without hatchings. In the shown state in FIG. 3, the openings of the pattern 8 of the mask 5 corresponds to pixels R in the substrate 1 side. By performing the vacuum evaporation in this state, organic materials to constitute the pixels R are selectively evaporated on the surface of the substrate 1. After the processing, by shifting the mask 5 to the right side by a pixel, the openings of the pattern 8 aligns with the regions of pixels G. And then, after changing the organic materials, the pixels G can be formed by performing the vacuum evaporation again. Similarly, by shifting the mask 5 to the right side further by a pixel, pixels B can be formed.

In the example shown in FIG. 3, the intervals between the stripes of the arranged barrier plates 6 are set to be, for example 300 μm. On the other hand, the sizes of the openings formed in the pattern 8 of the mask 5 are, for example 70 μm×200 μm. Moreover, the mask 5 is made from, for example, stainless steel, and the thickness thereof is, for example, about 50 μm. On the other hand, the thickness of the barrier plate 6 that regulates the size of the gap between the substrate 1 and the mask 5 is, for example, about 5 μm.

Figure 4A:
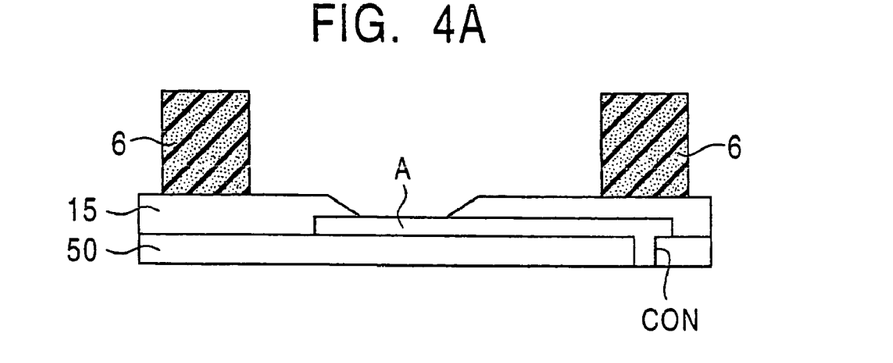
FIG. 4A–FIG. 4C are process drawings showing a method for manufacturing an organic electro-luminescent element according to the present invention.
Figure 4B:
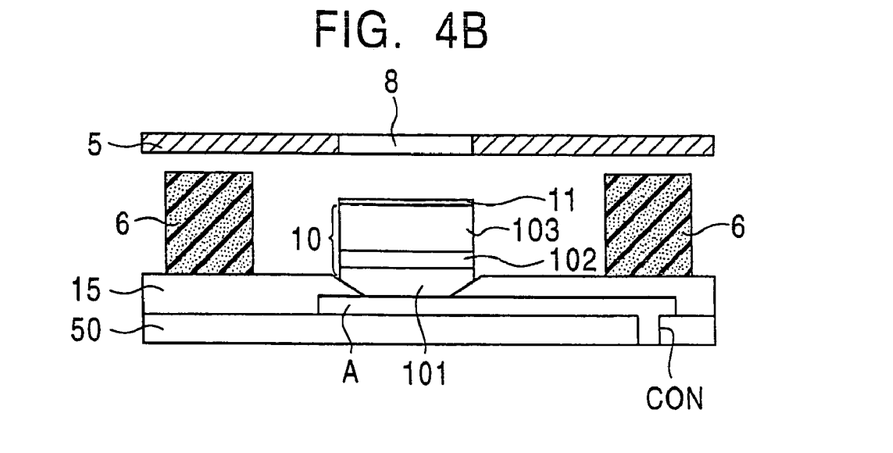
Figure 4C:
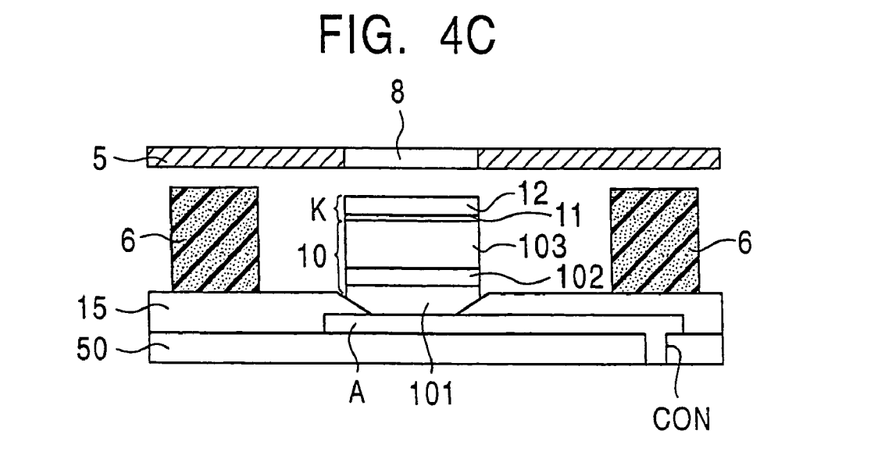

Next, FIGS. 4A–4C are referred while an example of a method for forming a pixel of an electro-luminescent element on a glass substrate by using the mask shown in FIG. 3 is concretely described.

At first, as shown in FIG. 4A, chromium (Cr) was formed on the interlayer isolation film 50, in which contact holes CON had been formed in advance, to be 200 nm in film thickness by means of DC sputtering. Incidentally, lower layers under the interlayer isolation film 50 are omitted in the drawings. Argon (Ar) was used as the sputter gas. The pressure of the sputter gas was 0.2 Pa, and the DC output of the DC sputtering was 300 W.

Then, the interlayer isolation film 50 was patterned to be a prescribed shape by means of an ordinary lithographic technique. The processing was done by utilizing ETCH-1 made by Sanyo Chemical Industries, Ltd. as etching liquid. Thereby, the anode A having a prescribed shape could be obtained. The chromium can be treated by the etching liquid with high accuracy and good reproducibility. If further higher accuracy of finishing is requested, it may be processed by dry etching. As an etching gas, a mixed gas of chlorine ($Cl_2$) and oxygen ($O_2$) may be used as the etching gas. In particular, if reactive ion etching (RIE) is used, high accuracy processing can be performed, and the shape of an etching surface can be controlled. If the etching is performed under a prescribed conditions, the processing to a tapered shape can be performed to decrease short circuits between the cathode K and the anode A.

Successively, the insulating layer 15 was formed on the interlayer isolation film 50 where the chromium had been processed to the prescribed pattern. The material to be used as the insulating layer 15 is not specially limited. In the present embodiment, silicon dioxide ($SiO_2$) was used. The $SiO_2$ was formed to have a film thickness of 200 nm by sputtering. The method for forming the insulating layer 15 is not specially limited.

Then, the $SiO_2$ was processed to have an opening over the anode A made from the chromium by means of an ordinal lithographic technique. A mixed liquid of fluoric acid and ammonium fluoride can be used for etching of the $SiO_2$. Moreover, dry etching processing is also applicable. The aforesaid opening portion is a light emission portion of the organic electro-luminescent element. Incidentally, the insulating layer 15 is not absolutely necessary to the present invention, but it is desirable to equip the insulating layer 15 for preventing the short circuits between the anode A and the cathode K. After these processes, the barrier plates 6 were formed on the both sides of the opening by means of, for example sputtering.

Next, as shown in FIG. 4B, a mask 5 was placed over the interlayer isolation film 50 by putting the barrier plates 6 between the mask 5 and the interlayer isolation film 50. Incidentally, the opening formed in the pattern 8 of the mask 5 was positioned by, for example, making a mark of the mask 5 coincide with a mark put on the glass substrate beforehand so as to align with the aforesaid opening portion of the insulating layer 15.

The substrate combined with the mask 5 was thrown into a vacuum evaporator to form the organic layer 10 and the metal layer 11 of the cathode K by evaporation.

The organic layer 10 had layers of 4, 4', 4"-tris (3-methylphenyl phenylamino) triphenyl amine (MTDATA) as a hole injecting layer 101, a bis (N-naphthyl)-N-phenyl benzidine (α-NPD) as a hole transporting layer 102, and an 8-quinolinol aluminum complex (Alq) as a luminescent layer 103.

The cathode K had the metal layer 11 of an alloy of magnesium and silver (Mg:Ag).

0.2 gram of each material belonging to the organic layer 10 was filled in a boat for electric resistance heating. Then, the boat was attached to a predetermined electrode of the vacuum evaporator. 0.1 gram of the magnesium and 0.4 gram of the silver of the metal layer 11 were filled in another boat. And then, the boat was attached to another predetermined electrode in the vacuum evaporator. The vacuum chamber of the vacuum evaporator was decompressed to $1.0 \times 10^{-4}$ Pa. And then, voltages were imposed on each boat. Thereby, each boat was heated in turn to evaporate the materials filled in each boat. In the evaporation process, an evaporation mask was used to form the organic layer 10 and the metal layer 11 composed of Mg:Ag by evaporation only at a predetermined portion. The predetermined portion was a portion where the chromium was exposed. It is difficult to evaporate those materials only the portion where the chromium is exposed at a high accuracy. Accordingly, the inventors designed the evaporation mask so as to cover the whole portion where the chromium was exposed, namely so as to cover also the edge of the insulating layer 15.

At first, MTDATA was evaporated to form the hole injecting layer 101 in thickness of 30 nm. Then, α-NPD was evaporated to form the hole transporting layer 102 in thickness of 20 nm. And further, Alq was evaporated to form the luminescent layer 103 in thickness of 50 nm.

Furthermore, the metal layer 11 of Mg:Ag of the cathode K was formed on the organic layer 10 by coevaporating magnesium and silver. The ratio of the speed of forming the film of the metal layer 11 of the magnesium to the silver was 9:1. The thickness of the film of Mg:Ag was 10 nm.

At last, as shown in FIG. 4C, the interlayer isolation film 50 was transferred to another vacuum chamber. Then, the transparent conducting layer 12 was formed on the metal layer 11 by means of the same mask 5. The DC sputtering was used for forming the interlayer isolation film 50. A transparent conducting film of In—Zn—O series that showed good conductivity by forming as a film at a room temperature was used as the transparent conducting layer 12. The film forming conditions were as follows. That is, a mixed gas of argon and oxygen (volume ratio: $Ar:O_2=1,000:5$) was used as the sputter gas; the pressure thereof was 0.3 Pa; and the DC output was 40 W. The thickness of the formed transparent conducting layer 12 was 200 nm.

Figure 5:
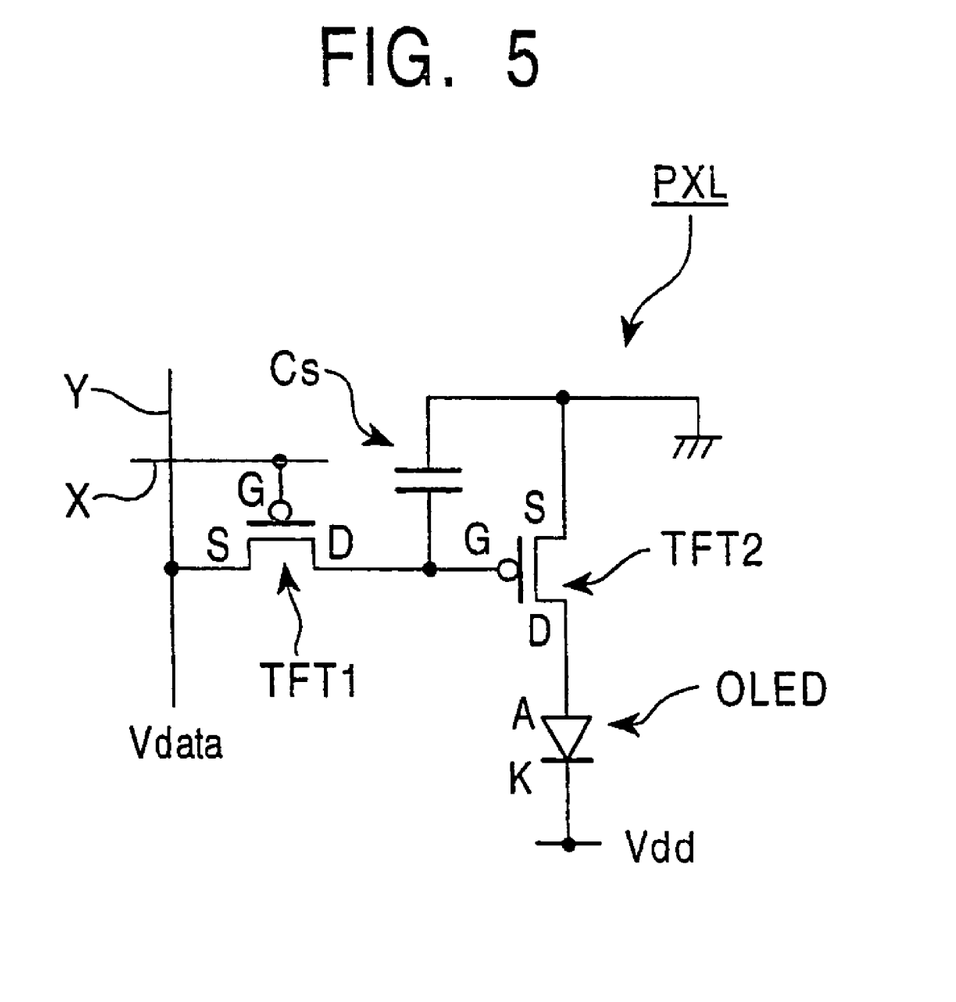
FIG. 5 is a circuit diagram showing an equivalent circuit of a pixel of the display apparatus shown in FIG. 1.

Lastly, an example of an equivalent circuit of one pixel is shown in FIG. 5. The pixel PXL is composed of an organic electro-luminescent element OLED, a thin film transistor TFT1 as a first active element, a thin film transistor TFT2 as a second active element, and a holding capacitance Cs. Because many organic electro-luminescent elements have a rectification characteristic, they are sometimes called as the organic light emitting diode. Accordingly, in FIG. 5, the organic electro-luminescent element OLED is indicated by a sign of a diode.

In FIG. 5, the source S of the thin film transistor TFT2 is set to be a reference potential, or the earth potential. The cathode K of the organic electro-luminescent element OLED is connected to a supply voltage Vdd. On the other hand, the anode A of the organic electro-luminescent element OLED is connected to the drain D of the thin film transistor TFT2. Moreover, the gate G of the thin film transistor TFT1 is connected to the scanning wiring X. The source S of the thin film transistor TFT1 is connected to the data wiring Y. The drain D of the thin film transistor TFT1 is connected to the holding capacitance Cs and the gate G of the thin film transistor TFT2.

For operating the pixel PXL, at first, the scanning wiring X is made to be a selected state. Then, when a data voltage Vdata indicating the brightness information is imposed on the data wiring Y, the thin film transistor TFT1 is conducted. Then, the holding capacitance Cs is charged or discharged. Consequently, the gate voltage of the thin film transistor TFT2 accords with the data voltage Vdata.

When the scanning wiring X is made to be a non-selected state, the thin film transistor TFT1 turns off. Then, the thin film transistor TFT2 is electrically cut off from the data wiring Y. However, the gate voltage of the thin film transistor TFT2 is stably held by the holding capacitance Cs. The current flowing through the organic electro-luminescent element OLED through the thin film transistor TFT2 comes to have a value according to the voltage Vgs between the gate G and the source S of the thin film transistor TFT2. Consequently, the organic electro-luminescent element OLED keeps emitting light at the brightness in accordance with the amount of current supplied from the thin film transistor TFT2.

Figure 6:
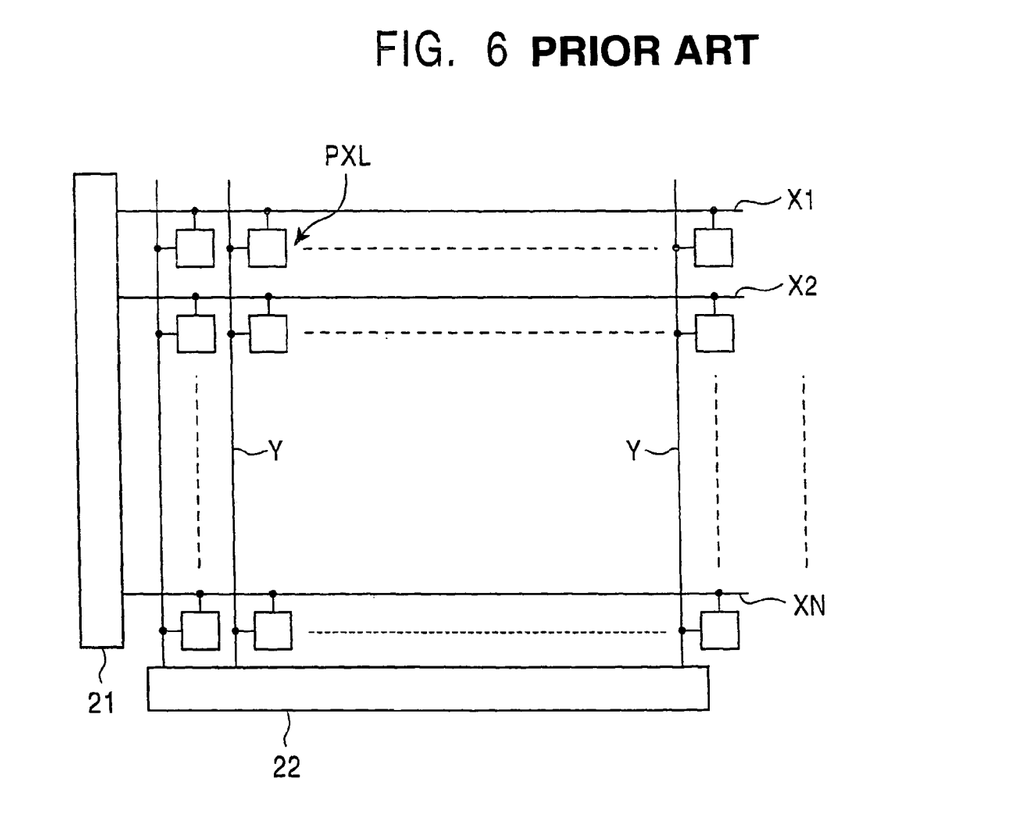
FIG. 6 is a circuit diagram showing the whole structure of the display apparatus shown in FIG. 1.

As described above, in the circuit structure of the pixel PXL shown in FIG. 5, when once the data voltage Vdata is written in the pixel PXL, the organic electro-luminescent element OLED keeps emitting light at a fixed brightness during a frame interval until the written data voltage Vdata is next re-written. When many pixels PXL like this are arranged in a matrix form as shown in FIG. 6, an active matrix type display apparatus can be constituted. As shown in FIG. 6, the display apparatus is composed by arranging the scanning wirings X1 to XN for selecting the pixels PXL and the data wirings Y for supplying the brightness information, i.e. data voltages Vdata, for driving the pixels PXL arranged in a matrix form.

The scanning wirings X1 to XN are connected with a scanning wiring driving circuit 21. On the other hand, the data wirings Y are connected with a data wiring driving circuit 22. A desired image can be displayed by repeating writing the data voltages Vdata from the data wirings Y by the data wiring driving circuit 22 while selecting the scanning wirings X1 to XN in turn by the scanning wiring driving circuit 21. In the simple matrix type display apparatus, a luminous element included in each pixel PXL emits light only an instance when it is selected. On the contrary, in the active matrix type display apparatus shown in FIG. 6, the organic electro-luminescent element of each pixel PXL keeps emitting light even after the completion of writing interval. Consequently, when the active matrix type display apparatus is used in a display having a large size and high resolution, it is advantageous in that the peak brightness, or the peak current, of the organic electro-luminescent element can be decreased in comparison with that of the simple matrix type display apparatus.

Although the invention has been described in its preferred form with a certain degree of particularity, obviously many changes and variations are possible therein. It is therefore to be understood that the present invention may be practiced than as specifically described herein without departing from scope and the sprit thereof.

What is claimed is:

1. A method for manufacturing a display apparatus including a substrate, a plurality of pixels formed on said substrate, and a barrier plate for separating adjoining pixels of said pixels from each other, each of said pixels having a lower layer portion including a wiring formed on said substrate, an upper portion including an organic electro-luminescent element, and a middle layer portion for insulating said lower layer portion and said upper layer portion from each other electrically, said method comprising the steps of:

forming said lower layer portion including the wiring on said substrate;

forming said middle layer portion so as to cover said lower layer portion;

forming a contact hole connected with the wiring in said middle layer;

forming said organic electro-luminescent element on said middle layer portion to connect said organic electro-luminescent element with the wiring in said lower layer portion through the contact hole formed in said middle layer portion; and disposing said barrier plate so as to overlap with a region including the contact hole, wherein:

said step of forming said organic electro-luminescent element is to form said organic electro-luminescent element composed of a reflective anode connected to said wiring, a transparent cathode disposed at a front face of said organic electro-luminescent element, and an organic layer held between the anode and the cathode, and the organic layer emits light by recombination of a hole supplied from the anode and an electron supplied from the cathode, and further the emitted light is taken out of the cathode disposed at the front face.

2. The method according to claim 1, wherein:
said organic layer is formed by piling laminated films selectively by means of a mask disposed over said substrate in a way of putting said barrier plate between the mask and said substrate.

3. The method according to claim 1, wherein:
said step of forming said lower layer portion comprises the steps of: forming a scanning wiring, a part of said wiring, for supplying first electric information for selecting said pixels;

forming a data wiring, another part of said wiring, for supplying brightness information for driving said pixels;

forming a first active element controlled by second electric information supplied from the scanning wiring and having a function of writing the brightness information supplied from the data wiring into one of said pixels; and forming a second active element having a function of controlling emission of light of said organic electro-luminescent element by supplying a current to said organic electro-luminescent element in accordance with the written brightness information.

4. A method for manufacturing a display apparatus comprising:

forming a lower layer portion on a substrate, said lower layer portion including connecting wiring;

forming a middle layer portion on a lower layer portion, said middle layer portion having a contact region and a light emitting region;

forming a contact hole within said middle layer portion, said contact hole being disposed at said contact region;

forming a reflective layer on said middle layer portion, said reflective layer being formed at said contact region and at said light emitting region, said reflective layer being electrically connected with said connecting wiring through said contact hole;

forming a barrier plate over said contact region, said reflective layer being exposed within said light emitting region;

forming an organic layer over said reflective layer, said organic layer being formed over said light emitting region; and forming a transparent layer over said organic layer, wherein said reflective layer, said organic layer and said transparent layer form an organic electro-luminescent element.

5. The method according to claim 4, wherein before the step of forming said barrier plate, the method further comprising:

forming an insulating layer over said reflective layer; and forming a window within said insulating layer over said light emitting region to expose said reflective layer, said insulating layer remaining over said contact region.

6. The method according to claim 4, wherein before the step of forming said organic layer, the method further comprising:

forming a mask over said barrier plate for forming said organic layer, said mask having an aperture over said light emitting region.

7. The method according to claim 4, wherein:

a pixel of is associated with said organic electro-luminescent element.

8. The method according to claim 4, wherein the step of forming said lower layer portion comprises the steps of:

forming pixels on said substrate, said barrier plate separating one of pixels from another of said pixels;

forming a scanning wiring on said substrate, said scanning wiring supplying first electric information for selecting said one of said pixels;

forming data wiring in said lower layer portion, said data wiring supplying brightness information for driving said one of said pixels;

forming a first active element, said first active element being controllable by second electric information supplied from said scanning wire to write brightness information supplied from said data wiring into said one of said pixels; and forming a second active element, said second active element being adapted to control emission of light from said organic electro-luminescent element by supplying a current to said organic electro-luminescent element in accordance with said written brightness information.

9. The method according to claim 8, wherein:

an electric potential of said transparent layer is common value for each of said pixels.

10. The method according to claim 4, wherein:

said transparent layer is formed over said barrier plate.

11. The method according to claim 4, wherein:

said organic layer emits light by recombination of holes supplied from said reflective layer and electrons supplied from said transparent layer, said emitted light passing through said transparent layer.

12. The method according to claim 4, wherein:

said organic layer is a laminate of a hole injecting layer, a hole transporting layer, and a luminescent layer.

13. The method according to claim 4, wherein:

said organic layer is formed by an evaporation method.

14. The method according to claim 4, wherein:

said reflective layer is a light reflective anode and said transparent layer is a transparent cathode.

15. The method according to claim 4, wherein:

said contact hole exposes said connecting wiring.

16. The method according to claim 4, wherein:

said reflective layer is in contact with said connecting wiring.

17. The method according to claim 4, wherein:

said barrier plate is not in physical or electrical contact with either said organic electro-luminescent element or said anode.

18. The method according to claim 4, wherein:

said reflective layer is formed of a metal.

19. The method according to claim 18, wherein:

said metal is from the group comprising Aluminum and Chromium.

* * * * *

UNITED STATES PATENT AND TRADEMARK OFFICE
CERTIFICATE OF CORRECTION

PATENT NO. : 6,969,291 B2
DATED : November 29, 2005
INVENTOR(S) : Urabe et al.

It is certified that error appears in the above-identified patent and that said Letters Patent is hereby corrected as shown below:

Column 11,
Line 53, delete "of".

Signed and Sealed this

Second Day of May, 2006

JON W. DUDAS
*Director of the United States Patent and Trademark Office*